US012787344B2

(12) United States Patent
Kikuchi

(10) Patent No.: US 12,787,344 B2
(45) Date of Patent: Nov. 3, 2026

(54) AMPLIFIER CIRCUIT

(71) Applicant: Sumitomo Electric Industries, Ltd., Osaka (JP)

(72) Inventor: Ken Kikuchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 415 days.

(21) Appl. No.: 18/543,849

(22) Filed: Dec. 18, 2023

(65) Prior Publication Data

US 2024/0339535 A1 Oct. 10, 2024

(30) Foreign Application Priority Data

Apr. 5, 2023 (JP) ................................ 2023-061667

(51) Int. Cl.
*H10D 30/60* (2025.01)
*H10D 62/13* (2025.01)

(52) U.S. Cl.
CPC ......... *H10D 30/611* (2025.01); *H10D 62/149* (2025.01)

(58) Field of Classification Search
CPC .......................... H10D 30/611; H10D 30/471
See application file for complete search history.

(56) References Cited

U.S. PATENT DOCUMENTS

2022/0321062 A1* 10/2022 Struble .................. H03F 3/211

FOREIGN PATENT DOCUMENTS

JP 2022-094128 A 6/2022

OTHER PUBLICATIONS

Ferdinando Costanzo et al., "A Ka-band Doherty Power Amplifier using an innovative Stacked-FET Cell", Proceeding of 2019 15th Conference on Ph. D Research in Microelectronics and Electronics (PRIME), pp. 165-168, Aug. 5, 2019.

* cited by examiner

*Primary Examiner* — Yu-Hsi D Sun
(74) *Attorney, Agent, or Firm* — Volpe Koenig

(57) ABSTRACT

An amplifier circuit includes a first FET including first source, first gate and first drain electrodes, and a first field plate having a part thereof provided above a semiconductor layer between the first gate and the first drain electrodes, and a second FET including second source, second gate and second drain electrodes, and a second field plate having a part thereof provided above the semiconductor layer between the second gate and the second drain electrodes, wherein a first distance between an end closer to the first drain electrode in a surface of the first gate electrode and an end closer to the first drain electrode in the first field plate is shorter than a second distance between an end closer to the second drain electrode in a surface of the second gate electrode and an end closer to the second drain electrode in the second field plate.

10 Claims, 13 Drawing Sheets

FIG. 6

| FET Q1 | AVERAGE VALUE OF POTENTIAL [V] |
|---|---|
| SOURCE POTENTIAL Vs | 0 |
| GATE POTENTIAL Vg | -3 |
| DRAIN POTENTIAL Vd | 47 |

FIG. 7

| FET Q2 | AVERAGE VALUE OF POTENTIAL [V] |
|---|---|
| SOURCE POTENTIAL Vs | 51 |
| GATE POTENTIAL Vg | 47 |
| DRAIN POTENTIAL Vd | 96 |

AMPLIFIER CIRCUIT

CROSS REFERENCE TO RELATED APPLICATIONS

This application claims priority based on Japanese Patent Application No. 2023-061667 filed on Apr. 5, 2023, and the entire contents of the Japanese patent applications are incorporated herein by reference.

FIELD

The present disclosure relates to an amplifier circuit.

BACKGROUND

There is known an amplifier circuit in which a source-grounded field effect transistor (FET) and a gate-grounded FET are cascode-connected, as a high frequency amplifier circuit (for example, Non-Patent Document 1: Proceeding of 2019 15th Conference on Ph. D Research in Microelectronics and Electronics (PRIME), pp. 165 to 168, Ferdinando Costanzo et al. "A Ka-band Doherty Power Amplifier using an innovative Stacked-FET Cell").

SUMMARY

An amplifier circuit according to the present disclosure includes: a first FET (Field Effect Transistor) including a first source electrode provided on the semiconductor layer and connected to a first reference potential in a high frequency manner, a first gate electrode provided on the semiconductor layer and inputting a high frequency signal, a first drain electrode provided on the semiconductor layer, and a first field plate having at least a part thereof provided above the semiconductor layer between the first gate electrode and the first drain electrode; and a second FET including a second source provided on the semiconductor layer and electrically connected to the first drain, a second gate provided on the semiconductor layer and connected to a second reference potential in the high frequency manner, a second drain provided on the semiconductor layer and outputting a high frequency signal, and a second field plate having at least a part thereof provided above the semiconductor layer between the second gate electrode and the second drain electrode; wherein a first distance between an end closer to the first drain electrode in ends of a surface of the first gate electrode facing the semiconductor layer and an end closer to the first drain electrode in ends of the first field plate is shorter than a second distance between an end closer to the second drain electrode in ends of a surface of the second gate electrode facing the semiconductor layer and an end closer to the second drain electrode in ends of the second field plate.

BRIEF DESCRIPTION OF DRAWINGS

FIG. 6 is a diagram illustrating average values of respective potentials of the FET Q1 in simulation.

FIG. 7 is a diagram illustrating average values of respective potentials of the FET Q2 in simulation.

DETAILED DESCRIPTION OF EMBODIMENTS

Figure 1:
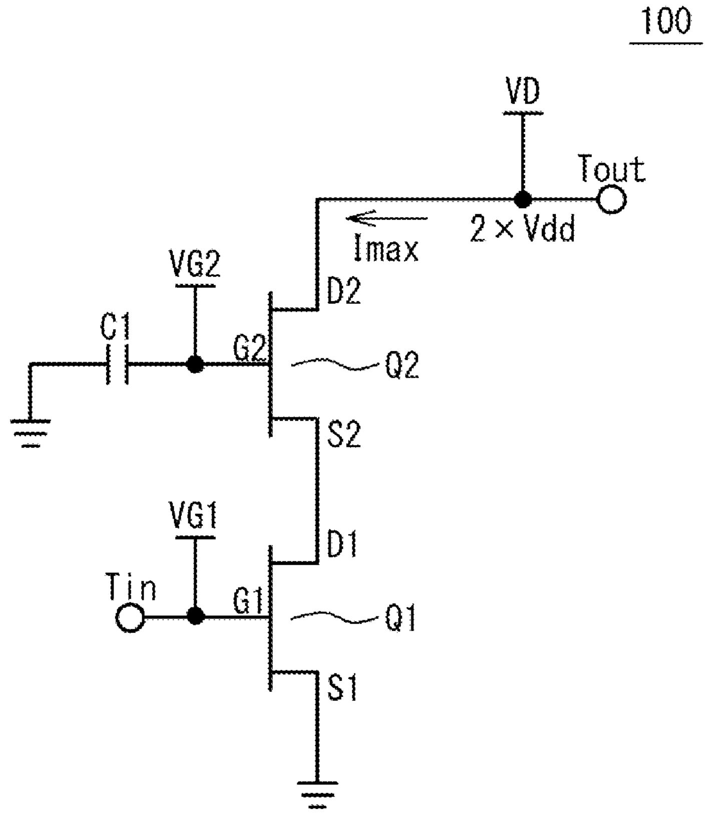
FIG. 1 is a circuit diagram of an amplifier circuit according to a first embodiment.

When a field plate is used for the FETs of the cascode-connected amplifier circuit, it is required to provide the field plate so as to improve the characteristics of the amplifier circuit.

The present disclosure has been made in view of the above problem, and an object of the present disclosure is to improve the characteristics of the amplifier circuit.

Details of Embodiments of the Present Disclosure

First, the contents of the embodiments of this disclosure are listed and explained.

(1) An amplifier circuit according to the present disclosure includes: a first FET (Field Effect Transistor) including a first source electrode provided on the semiconductor layer and connected to a first reference potential in a high frequency manner, a first gate electrode provided on the semiconductor layer and inputting a high frequency signal, a first drain electrode provided on the semiconductor layer, and a first field plate having at least a part thereof provided above the semiconductor layer between the first gate electrode and the first drain electrode; and a second FET including a second source provided on the semiconductor layer and electrically connected to the first drain, a second gate provided on the semiconductor layer and connected to a second reference potential in the high frequency manner, a second drain provided on the semiconductor layer and outputting a high frequency signal, and a second field plate having at least a part thereof provided above the semiconductor layer between the second gate electrode and the second drain electrode; wherein a first distance between an end closer to the first drain electrode in ends of a surface of the first gate electrode facing the semiconductor layer and an end closer to the first drain electrode in ends of the first field plate is shorter than a second distance between an end closer to the second drain electrode in ends of a surface of the second gate electrode facing the semiconductor layer and an end closer to the second drain electrode in ends of the second field plate. This makes it possible to suppress electric field concentration in the semiconductor layer between the gate electrode and the drain electrode in the second FET and to improve the high frequency characteristics of the first FET. Therefore, the characteristics of the amplifier circuit can be improved.

(2) In the above (1), the first field plate and the first source electrode may have a same potential, and the second field plate and the second source electrode may have a same potential. This improves the characteristics of the amplifier circuit.

(3) In the above (1) or (2), the first distance may be 0.9 times or less the second distance. This improves the characteristics of the amplifier circuit.

(4) In any one of the above (1) to (3), a first length of a portion of a lower surface of the first field plate parallel to an upper surface of the semiconductor layer in a direction in which the first gate electrode and the first drain electrode are arranged may be shorter than a second length of a portion of a lower surface of the second field plate parallel to an upper surface of the semiconductor layer in a direction in which the second gate electrode and the second drain electrode are arranged. This improves the characteristics of the amplifier circuit.

(5) In the above (4), the first length may be 0.9 times or less the second length. This makes it possible to suppress the electric field concentration in the semiconductor layer between the gate electrode and the drain electrode in the second FET.

(6) In the above (4) or (5), the first length may be 0.02 times or more and 0.2 times or less a distance between the first gate electrode and the first drain electrode, and the second length may be 0.1 times or more and 0.5 times or less a distance between the second gate electrode and the second drain electrode. This makes it possible to suppress the electric field concentration in the semiconductor layer between the gate electrode and the drain electrode in the second FET.

(7) In any one of the above (1) to (6), a gate width of the first FET may be the same as a gate width of the second FET. This improves the characteristics of the amplifier circuit.

(8) In the above (7), a first gate bias voltage applied to the first gate electrode may be equal to a value obtained by subtracting a half of the drain bias voltage applied to the second drain electrode from a second gate bias voltage applied to the second gate electrode. This makes it possible to suppress the electric field concentration in the semiconductor layer between the gate electrode and the drain electrode in the second FET.

(9) In any one of the above (1) to (8), the semiconductor layer may be a nitride semiconductor layer. This makes it possible to suppress a memory effect in the second FET.

(10) In any one of the above (1) to (8), at least the part of the first field plate may overlap at least a part of the first gate electrode when viewed in a thickness direction of the semiconductor layer, and at least the part of the second field plate may overlap at least a part of the second gate electrode when viewed in the thickness direction of the semiconductor layer. This makes it possible to suppress the gate-drain capacitance in the first FET and the second FET.

Specific examples of a cascode amplifier and a method for manufacturing the same according to embodiments of the present disclosure will be described below with reference to the drawings. It should be noted that the present disclosure is not limited to these examples, but is defined by the claims and is intended to include all modifications within the meaning and scope equivalent to the claims.

First Embodiment

FIG. 1 is a circuit diagram of an amplifier circuit according to a first embodiment. As illustrated in FIG. 1, an amplifier circuit 100 includes a FET Q1 (first FET) and a FET Q2 (second FET) which are cascode-connected to each other. The FET Q1 is a source-grounded FET. The FET Q2 is a gate-grounded FET. A source S1 (first source electrode) of the FET Q1 is connected to a ground (first reference potential) in a high-frequency manner. A gate G1 is connected to an input terminal Tin, and a high frequency signal is input to the gate G1. A source S2 (second source electrode) of the FET Q2 is electrically connected to a drain D1 (first drain electrode) of the FET Q1 and is short-circuited. Thus, the source S2 and the drain D1 have the same potential. A gate G2 (second gate electrode) of the FET Q2 is connected to the ground (second reference potential) via a capacitor C1 in a high-frequency manner. A drain D2 (second drain electrode) is connected to an output terminal Tout from which a high frequency signal is outputted.

A gate bias voltage VG1 of the FET Q1 is applied to the gate G1. A gate bias voltage VG2 of the FET Q2 is applied to the gate G2. A drain bias voltage VD of the FET Q2 is applied to the drain D2 of the FET Q2. An impedance matching circuit (not illustrated) and a bias circuit (not illustrated) that supplies the gate bias voltage VG1 to the gate G1 are connected between the gate G1 and the input terminal Tin. A bias circuit (not illustrated) that supplies the gate bias voltage VG2 to the gate G2 is connected to the gate G2. An impedance matching circuit (not illustrated) and a bias circuit (not illustrated) that supplies the drain bias voltage VD to the drain D2 are connected between the drain D2 and the output terminal Tout. The gate widths of the FET Q1 and the FET Q2 may be the same as each other or different from each other.

The FETs Q1 and Q2 are, for example, GaN HEMTs (Gallium Nitride High Electron Mobility Transistors). The FETs Q1 and Q2 may be GaAs-based FETs.

A center frequency of the band of the amplifier circuit 100 is, for example, 0.5 GHz to 10 GHZ, and is used in a base station of mobile communication, for example.

Figure 2:
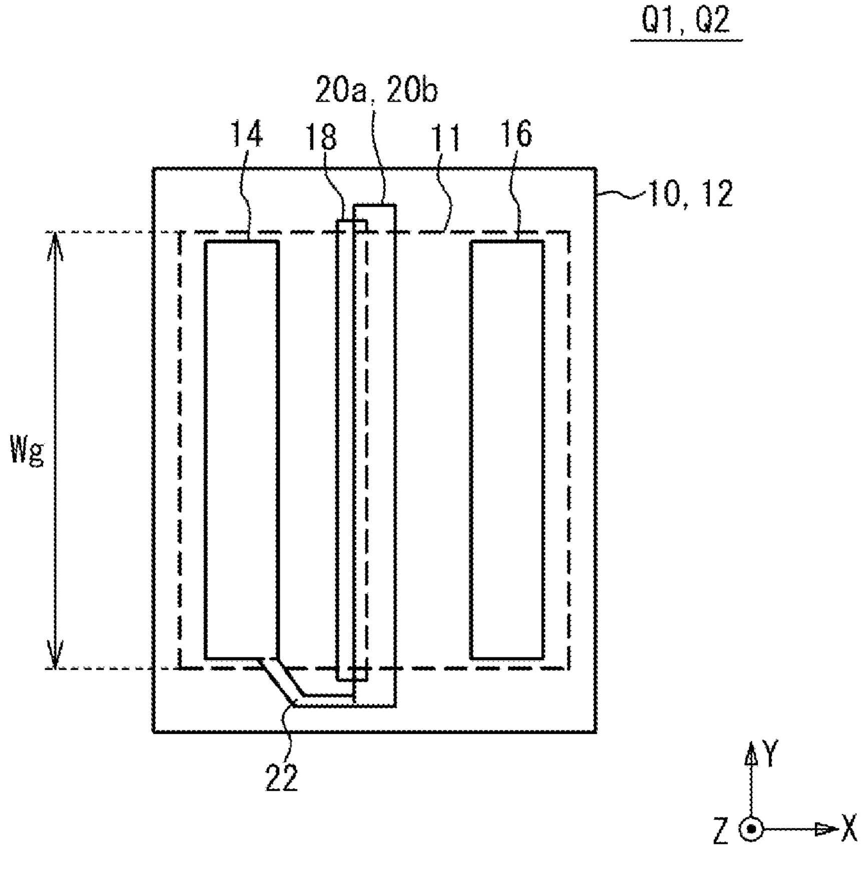
FIG. 2 is a plan view of the FET used in the first embodiment.
Figure 3:
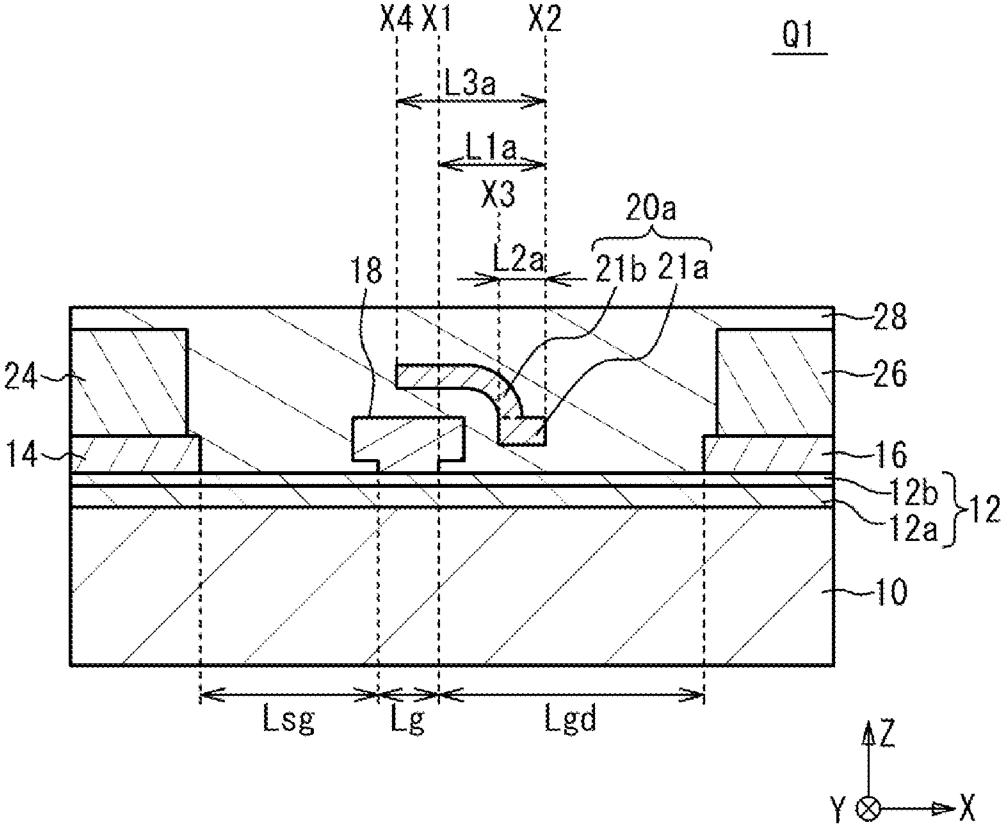
FIG. 3 is a cross-sectional view of an FET Q1 used in first embodiment.
Figure 4:
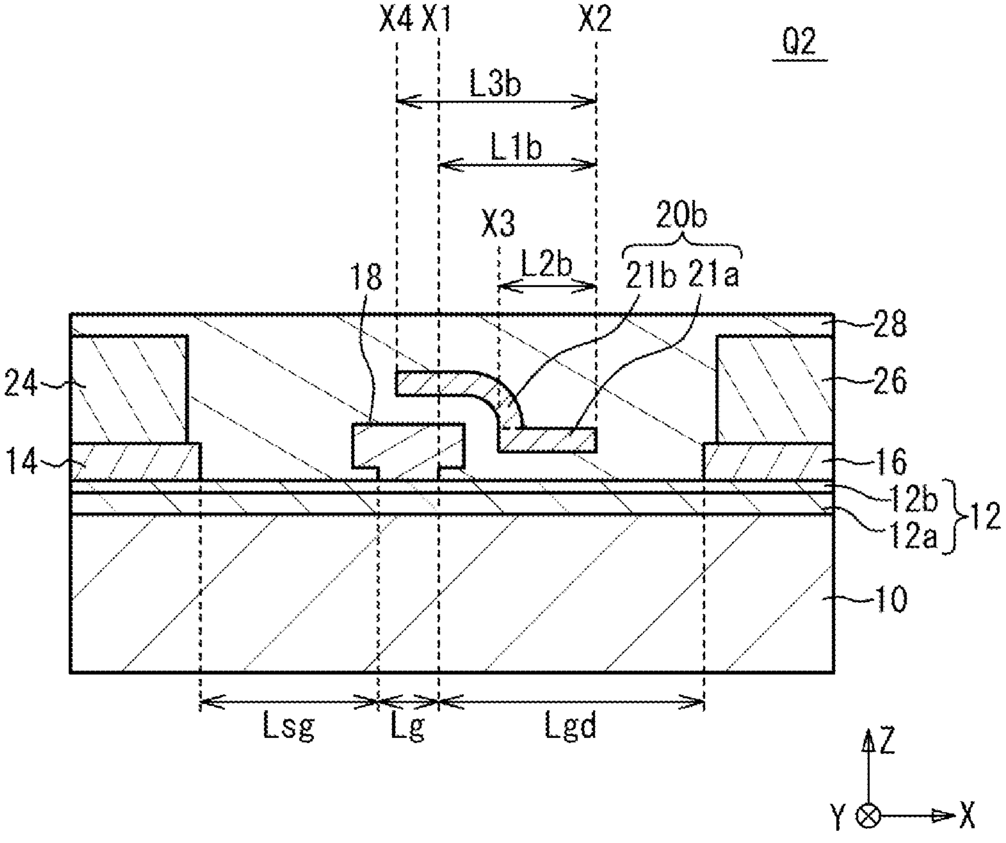
FIG. 4 is a cross-sectional view of an FET Q2 used in first embodiment.

FIG. 2 is a plan view of the FET used in the first embodiment. FIG. 3 is a cross-sectional view of the FET Q1 used in the first embodiment. FIG. 4 is a cross-sectional view of the FET Q2 used in the first embodiment. A thickness direction of a substrate 10 is a Z direction, an arrangement direction of a source electrode 14, a gate electrode 18, and a drain electrode 16 is an X direction, and an extension direction of the source electrode 14, the gate electrode 18, and the drain electrode 16 is a Y direction.

As illustrated in FIGS. 2 to 4, a semiconductor layer 12 is provided on the substrate 10. The semiconductor layer 12 includes, for example, a channel layer **12*a* and a barrier layer 12*b*. A region of the semiconductor layer 12 inactivated by ion implantation or the like is an inactive region, and a region not inactivated is an active region 11. The source electrode 14, the drain electrode 16 and the gate electrode 18 are provided on the active region 11 of the semiconductor layer 12. In the X direction, the gate electrode 18 is disposed between the source electrode 14 and the drain electrode 16. A source wiring 24 is provided on the source electrode 14, and a drain wiring 26 is provided on the drain electrode 16. An insulating film 28 is provided on the semiconductor layer 12 so as to cover the source electrode 14, the drain electrode 16, the gate electrode 18, the source wiring 24, and the drain wiring 26**.

A field plate **20*a* (first field plate) and a field plate 20*b* (second field plate) are provided in the insulating film 28. Each of the field plates 20*a* and 20*b* includes a bottom portion 21*a* and a top portion 21*b*. The bottom portion 21*a* is provided between the gate electrode 18 and the drain electrode 16, and above the semiconductor layer 12 across the insulating film 28. A lower surface of the bottom portion 21***a* is substantially parallel to an upper surface of the semiconductor layer 12. The top portion 21*b* is provided from the bottom portion 21*a* to a position above the gate electrode 18 (+Z direction). Each of the field plates 20*a* and 20*b* is electrically connected and short-circuited to the source electrode 14 by a connection wiring 22. As a result, the potential of the source electrode 14 and the potential of the field plates 20*a* and 20*b* become substantially the same as each other. The connection wiring 22 may pass over the gate electrode 18 in the active region 11 and be electrically connected to the source electrode 14. The potentials of the field plates 20*a* and 20*b* may be potentials other than the potential of the source electrode 14. The FETs Q1 and Q2 may be multi-finger type FETs.

At least a part of each of the field plates 20*a* and 20*b* is positioned above the semiconductor layer 12 between the gate electrode 18 and the drain electrode 16, so that the electric field concentration in the semiconductor layer 12 between the gate electrode 18 and the drain electrode 16 can be reduced. This improves the gate-drain breakdown voltage. In addition, the memory effect described later can be suppressed. Further, a gate-drain capacitance Cgd can be reduced. At least a part of the top portion 21*b* overlaps at least a part of the gate electrode 18 as viewed from the Z direction, thereby further suppressing the gate-drain capacitance Cgd. The top portion 21*b* and the gate electrode 18 may not overlap each other when viewed from the Z direction.

As illustrated in FIGS. 3 and 4, the shapes of the field plates 20*a* and 20*b* in the FETs Q1 and Q2 are different from each other. As illustrated in FIG. 3, in the FET Q1, a distance between an end X1 closer to the drain electrode 16 in ends of a surface of the gate electrode 18 facing the semiconductor layer 12 and an end X2 closer to the drain electrode 16 in ends of the field plate 20*a* is represented as L1*a*. A length of the bottom portion 21*a* (portion) having a lower surface substantially parallel to the upper surface of the semiconductor layer 12 in the X direction (that is, a distance between the ends X2 and X3 of the bottom portion 21*a* in the X direction) is represented as L2*a*. A width of the field plate 20*a* in the X direction (that is, a distance between the ends X2 and X4 of the field plate 20*a* in the X direction) is represented as L3*a*.

As illustrated in FIG. 4, in the FET Q2, a distance between the end X1 of the surface of the gate electrode 18 facing the semiconductor layer 12 and the end X2 of the field plate 20*b* is represented as L1*b*. A length of the bottom portion 21*a* in the X direction is represented as L2*b*. A width of the field plate 20*b* in the X direction is represented as L3*b*. L1*a*<L1*b*, L2*a*<L2*b* and L3*a*<L3*b* are satisfied.

A distance between the source electrode 14 and the gate electrode 18 is a source-gate distance Lsg, a distance between the gate electrode 18 and the drain electrode 16 is a gate-drain distance Lgd, and a length of the gate electrode 18 in the X direction is a gate length Lg. A width of the active region 11 in the Y direction is a gate width Wg. In the FET Q1 of FIG. 3 and the FET Q2 of FIG. 4, the source-gate distances Lsg are the same as each other, the gate-drain distances Lgd are the same as each other, the gate lengths Lg are the same as each other, and the gate widths Wg are the same as each other. At least one of the source-gate distances Lsg, the gate-drain distances Lgd, the gate lengths Lg, and the gate widths Wg may be different between the FETs Q1 and Q2. The source gate distance Lsg is, for example, 0.5 μm to 2 μm, the gate drain distance Lgd is, for example, 1 μm to 7 μm, and the gate length Lg is, for example, 0.05 μm to 1 μm.

In the case of a GaN HEMT, the substrate 10 is, for example, a silicon carbide (SiC) substrate, a sapphire substrate, or a gallium nitride (GaN) substrate. The channel layer 12*a* is, for example, a gallium nitride layer, and the barrier layer 12*b* is an aluminum gallium nitride (AlGaN) layer. Each of the source electrode 14 and the drain electrode 16 is a metal layer including, for example, a titanium layer and an aluminum layer stacked in this order from the semiconductor layer 12. The gate electrode 18 is a metal layer including, for example, a nickel layer and a gold layer stacked in this order from the semiconductor layer 12. The source wiring 24, the drain wiring 26, the field plates 20*a* and 20*b*, and the connection wiring 22 are metal layers, for example, gold layers. The insulating film 28 is an inorganic insulating film such as a silicon nitride film. At least a part of the insulating film 28 may be an organic insulating film such as a polyimide film or a BCB (benzocyclobutene) film.

First Comparative Example

Figure 5:
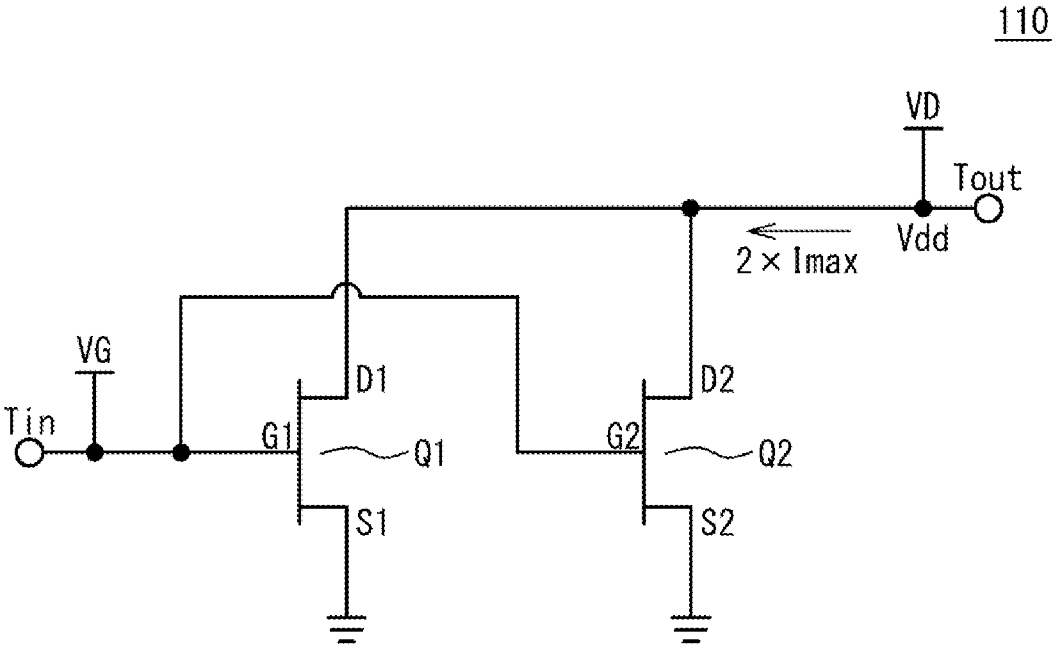
FIG. 5 is a circuit diagram of an amplifier circuit in a first comparative example.

FIG. 5 is a circuit diagram of an amplifier circuit in a first comparative example. As illustrated in FIG. 5, in an amplifier circuit 110 of the first comparative example, the FETs Q1 and Q2 in which their sources are grounded are connected in parallel. The sources S1 and S2 are electrically connected to the ground, the gates G1 and G2 are electrically connected to the input terminal Tin, and the drains D1 and D2 are electrically connected to the output terminal Tout. The gate bias voltage VG of the FETs Q1 and Q2 is applied to the gates G1 and G2. The drain bias voltage VD of the FETs Q1 and Q2 is applied to the drains D1 and D2.

In this way, the FETs Q1 and Q2 are connected in parallel between the input terminal Tin and the output terminal Tout. The high frequency signal input to the input terminal Tin is amplified by the FETs Q1 and Q2, and the amplified high frequency signal is output from the output terminal Tout.

In the source-grounded FET of the first comparative example, when an output power increases, the number of FETs connected in parallel increases. When the output power is doubled for one FET, two FETs Q1 and Q2 are connected in parallel. Assuming that a voltage Vdd is applied to one FET, the drain bias voltages VD applied to the drains D1 and D2 of the FETs Q1 and Q2 are the same voltage Vdd. Assuming that a maximum current in the case of the one FET is Imax, the maximum current flowing through the output terminal Tout is 2×Imax, which is twice as large as the current flowing through the output terminal Tout. This results in a load impedance of ½ for the FETs Q1 and Q2. Thus, when the output power increases in the source-grounded FET, the number of parallel connections of the FETs Q1 and Q2 increases, and the load impedance of the FETs Q1 and Q2 reduces. Therefore, a difference between the load impedance of the FETs Q1 and Q2 and a load resistance (e.g., 50Ω) increases. If the load impedance and the load resistance are matched by impedance conversion, it becomes difficult to achieve a wide band.

As illustrated in FIG. 1, in the amplifier circuit 100 of the first embodiment, the FETs Q1 and Q2 are cascode-connected in order to double the output power with respect to one FET. In this case, the maximum current to be outputted is Imax, which is the same as that in the case of one FET. The drain bias voltage VD applied to the drain D2 of the FET Q2 is 2×Vdd, which is twice Vdd in the case of one FET. The load impedance is four times as large as that in the case of one FET. In this manner, in the cascode-connected FET as in the first embodiment, even if the output power is increased, the load impedance can be larger than the load impedance in the parallel connection as in the first comparative example. Therefore, the difference between the load impedance and the load resistance (for example, 50Ω) becomes small, impedance conversion between the load impedance and the load resistance is facilitated, and a wider band is easily achieved.

[Simulation]

In a high-output FET, a field plate is used to increase a breakdown voltage. However, in an amplifier circuit in which the FETs Q1 and Q2 are cascode-connected, the appropriate structures of the field plates 20*a* and 20*b* of the FETs Q1 and Q2 are not known. Therefore, when the high frequency signal was input to the input terminal Tin, the changes with respect to time of the sources S1 and S2, the drains D1 and D2, and the gates G1 and G2 in the cascode-connected FETs Q1 and Q2 were simulated.

The simulation conditions are as follows.

Type of FETs Q1 and Q2: GaN HEMT

Gate length Lg of FETs Q1 and Q2: 0.5 μm

Gate width Wg of FETs Q1 and Q2: 2.6 μm

Distance Lsg between FETs Q1 and Q2: 1 μm

Distance Lgd between FETs Q1 and Q2: 4 μm

Gate bias voltage VG1: −3 V

Gate bias voltage VG2: 47 V

Drain bias voltage VD: 100 V

Frequency of input signal: 3.5 GHZ

Input signal power: 30 dBm

The ground potential was set to 0 V, the source potentials of the sources S1 and S2 in the FETs Q1 and Q2 were set to Vs, the drain potentials of the drains D1 and D2 were set to Vd, and the gate potentials of the gates G1 and G2 were set to Vg.

Figure 8:
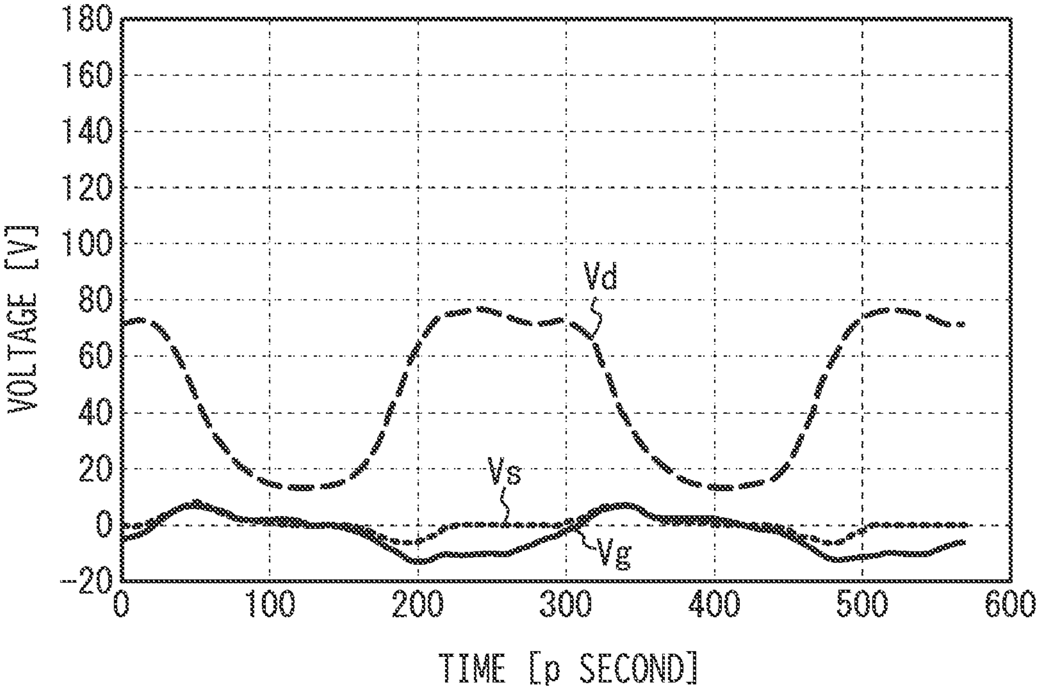
FIG. 8 is a diagram illustrating the potentials of the FET Q1 with respect to time in the simulation.
Figure 9:
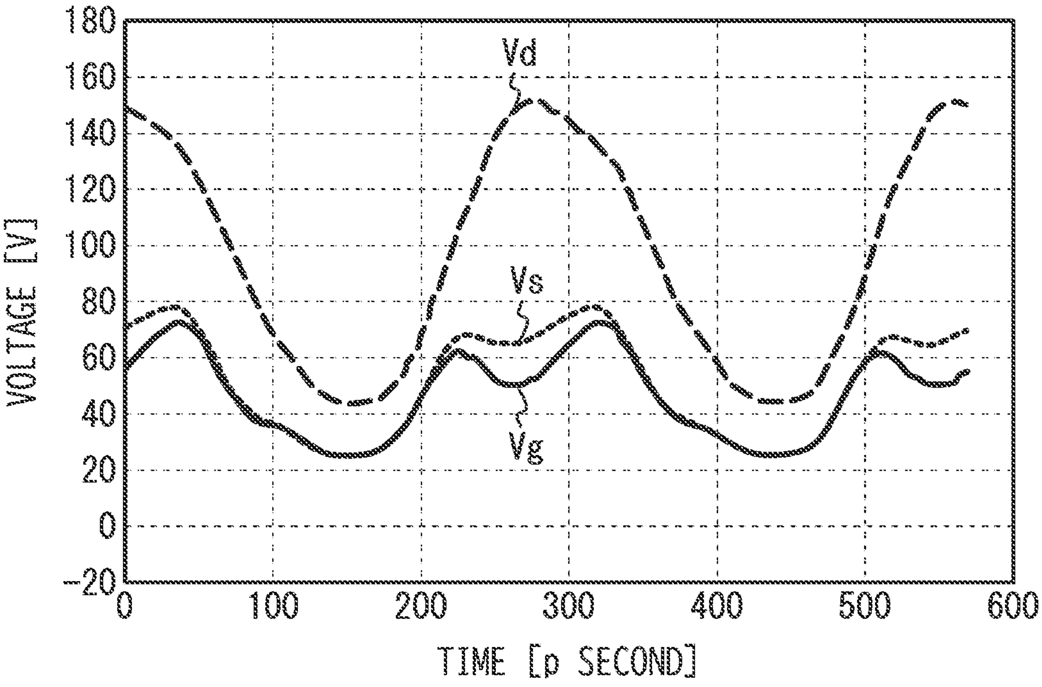
FIG. 9 is a diagram illustrating the potentials of the FET Q2 with respect to time in the simulation.

FIGS. 6 and 7 are diagrams illustrating averages of the respective potentials of the FETs Q1 and Q2 in the simulation. FIGS. 8 and 9 are diagrams illustrating the respective potentials of the FETs Q1 and Q2 with respect to time in the simulation. FIGS. 6 and 7 illustrate the time averages of the potentials in FIGS. 8 and 9, respectively. FIGS. 6 to 9 illustrate the source potential Vs, the drain potential Vd, and the gate potential Vg.

As illustrated in FIG. 6, in the FET Q1, the source potential Vs is substantially 0 V and is the ground potential. The gate potential Vg is approximately the gate bias voltage VG1 and is about −3 V. The drain potential Vd is approximately ½ of the drain bias voltage VD and is about 47 V.

As illustrated in FIG. 7, in the FET Q2, the source potential Vs is approximately ½ of the drain bias voltage VD and is about 51 V. The gate potential Vg is approximately the gate bias voltage VG2 and is about 47 V. The drain potential Vd is approximately the drain bias voltage VD and is about 96 V.

As illustrated in FIG. 6, in the FET Q1, a time-averaged potential Vg−Vs applied to the gate with respect to the source is about −3 V, and a time-averaged potential Vd-Vs applied to the drain with respect to the source is about 47 V. As illustrated in FIG. 7, in the FET Q2, a time-averaged potential Vg−Vs applied to the gate with respect to the source is about −4 V, and a time-averaged potential Vd-Vs applied to the drain with respect to the source is about 45 V.

As illustrated in FIGS. 8 and 9, the source potential Vs, the drain potential Vd, and the gate potential Vg change periodically with respect to time. The frequency of the change corresponds to the frequency of the input signal. Amounts of change, that is, amplitudes, in the source potential Vs, the drain potential Vd, and the gate potential Vg are larger in the FET Q2 than in the FET Q1.

Figure 10:
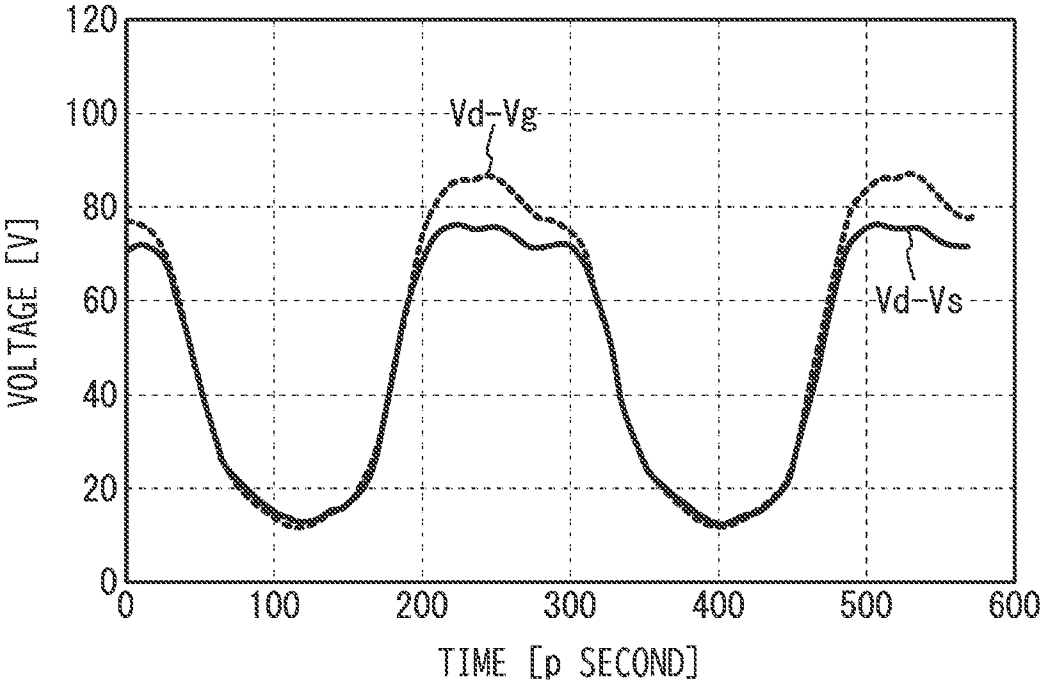
FIG. 10 is a diagram illustrating potential differences of the FET Q1 with respect to time in simulation.
Figure 11:
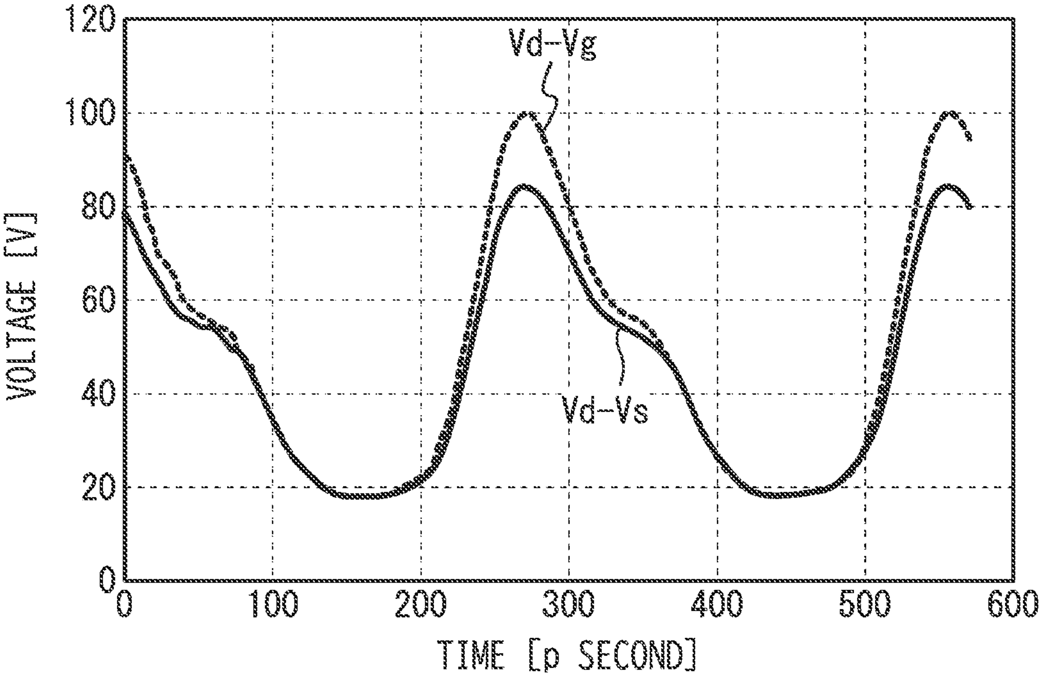
FIG. 11 is a diagram illustrating potential differences of the FET Q2 with respect to time in simulation.

FIGS. 10 and 11 are diagrams illustrating the potential differences of the FETs Q1 and Q2 with respect to time in the simulation, respectively. Each of FIGS. 10 and 11 illustrates a potential difference Vd-Vs of the drain with respect to the source, and a potential difference Vd-Vg of the drain with respect to the gate.

As illustrated in FIGS. 10 and 11, the amplitudes of the potential differences Vd−Vs and Vd−Vg are larger in the FET Q2 than in the FET Q1. For example, as illustrated in FIG. 10, the maximum and minimum values of the potential difference Vd−Vg in the FET Q1 are about 86 V and about 11 V, respectively. On the other hand, as illustrated in FIG. 11, the maximum value and the minimum value of the potential difference Vd−Vg in the FET Q2 are about 100 V and about 18 V, respectively.

When the amplitude of the potential difference Vd−Vg is large, the electric field concentration is likely to occur in the semiconductor layer 12 between the gate electrode 18 and the drain electrode 16. This may cause dielectric breakdown of the semiconductor layer 12 between the gate electrode 18 and the drain electrode 16. When an input signal having a large amplitude is input, there is a possibility that the FET Q2 mainly causes the dielectric breakdown.

When the electric field in the semiconductor layer 12 between the gate electrode 18 and the drain electrode 16 increases, a phenomenon called a memory effect is likely to occur. The memory effect is a drain idle current (Idq) drift or a drift phenomenon of a drain current called a current collapse phenomenon. The mechanism of the memory effect will be described. The high electric field increases the energy of electrons, and the electrons are captured by traps in the semiconductor layer 12. This reduces the drain current. Electrons captured in the trap are released with time. Therefore, when the electric field between the gate electrode 18 and the drain electrode 16 is reduced, the drain current recovers with time. In this way, the memory effect occurs. In the amplifier circuit 100, since the amplitude of the potential difference Vd-Vg of the FET Q2 is larger than that of the FET Q1, when the amplitude of the input signal changes, the memory effect occurs mainly in the FET Q2.

Figure 12:
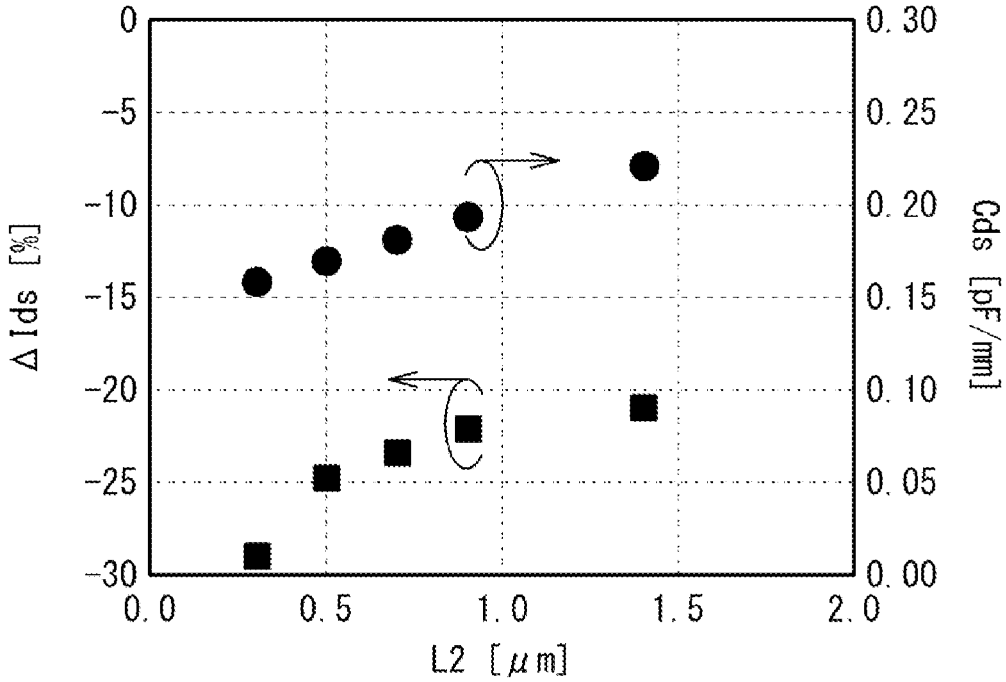
FIG. 12 is a diagram illustrating a change amount ΔIds of a drain current and a drain-source capacitance Cds with respect to a length L2.

The following represents a change amount ΔIds of the drain current and a drain-source capacitance Cds, which indicate a magnitude of the memory effect with respect to a length L2 in the X direction of the bottom portion 21*a* of the field plates 20*a* and 20*b* in the GaN HEMT. The length L2 corresponds to the length L2*a* of the FET Q1 and the length L2*b* of the FET Q2. FIG. 12 is a diagram illustrating the change amount ΔIds of the drain current and the drain-source capacitance Cds with respect to the length L2.

The change amount ΔIds of the drain current in FIG. 12 is measured as follows. In the measurement of the Ids−Vds characteristic of the FET, the gate voltage Vgs and the drain voltage Vds are applied at each measurement point in a pulse form to measure the drain current Id. The Ids−Vds characteristic when a reference point of the pulse measurement is set to Vgs=0 V and Vds=0 V is defined as a reference Ids−Vds characteristic. The Ids−Vds characteristic when the reference point of the pulse measurement is set to Vgs=−5 V and Vds=50 V is defined as an Ids−Vds characteristic at a stress time. When the gate voltage Vgs and the drain voltage Vds at a reference time are the same as the gate voltage Vgs and the drain voltage Vds at the stress time, the drain current Ids at the stress time is smaller than the drain current Ids at the reference time. The drain current Ids at Vgs=+2 V and Vds=5 V in the reference Ids−Vds characteristic is defined as Ids0, and the drain current Ids at Vgs=+2 V and Vds=5 V in the Ids−Vds characteristic at the stress time is defined as Ids1. At this time, an index expressing (Ids1−Ids0)/Ids0 in a percentage is defined as a change amount ΔIds of the drain current. The change amount ΔIds is negative. When the change amount ΔIds is close to 0, the memory effect is small, and when the change amount ΔIds is far from 0, the memory effect is large.

Regarding the drain-source capacitance Cds of FIG. 12, the S-parameter is measured using a network analyzer at an operating point of the GaN HEMT. The drain-source capacitance is extracted from the measured S-parameter. The drain-source capacitance Cds is expressed by a drain-source capacitance Cds at a unit gate width (1 mm), and a unit thereof is pF/mm. The operating point is Vgs=−3V and Vds=50 V.

As illustrated in FIG. 12, the memory effect reduces as the length L2 increases. For example, when the length L2 is 0.3 μm, the change amount ΔIds is about −29%, and when the length L2 is 1.4 μm, the change amount ΔIds is about −20%. Thus, when the length L2 is 1.4 μm, the change amount ΔIds is about ⅔ of that when the length L2 is 0.3 μm. When the length L2 is small, the change amount ΔIds largely changes as the length L2 changes, but when the length L2 is large, the change amount ΔIds does not change much even as the length L2 changes.

As the length L2 increases, the drain-source capacitance Cds increases. For example, the drain-source capacitance Cds is about 0.15 pF/mm when the length L2 is 0.3 μm, and the drain-source capacitance Cds is about 0.22 pF/mm when the length L2 is 1.4 μm. Thus, the drain-source capacitance Cds when the length L2 is 1.4 μm, is approximately 1.5 times as large as the drain-source capacitance Cds when the length L2 is 0.3 μm. The drain-source capacitance Cds changes substantially linearly with the length L2.

Figure 13:
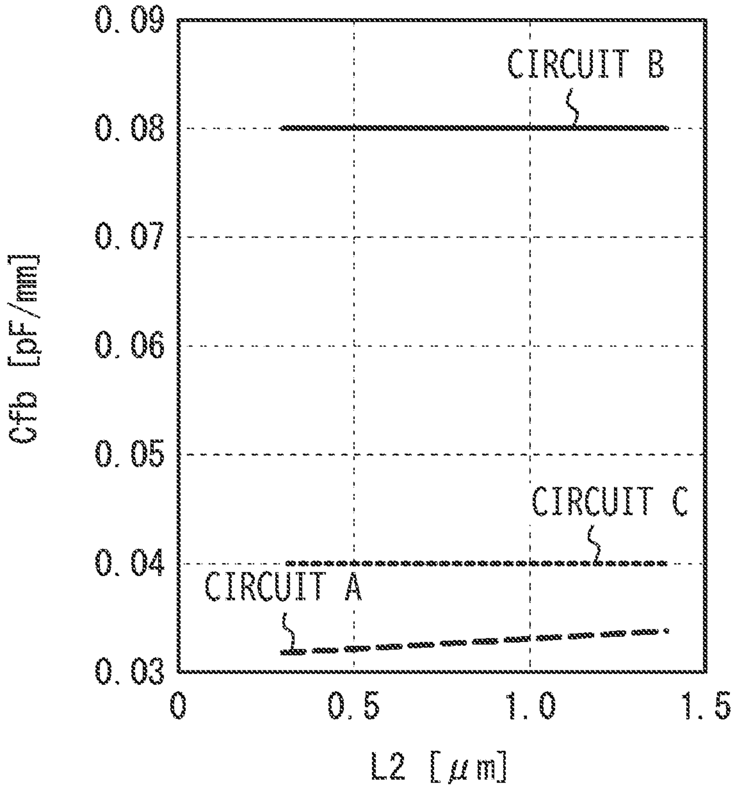
FIG. 13 is a diagram illustrating a feedback capacitance Cfb with respect to the length L2.

In order to increase a maximum oscillation frequency of the amplifier circuit, it is required to reduce a feedback capacitance Cfb. FIG. 13 is a diagram illustrating the feedback capacitance Cfb with respect to the length L2. A circuit A is a circuit in which the FETs Q1 and Q2 of the first embodiment are cascode-connected, and the feedback capacitance Cfb is a capacitance between the gate G1 and the drain D2 of the FET Q2 in FIG. 1. A circuit B is a circuit in which the FETs Q1 and Q2 of the first comparative example are connected in parallel, and the feedback capacitance Cfb is a capacitance between the gates G1 and G2 and the drains D1 and D2 in FIG. 5. A circuit C is a single FET Q1 or Q2, and the feedback capacitor Cfb is the gate drain capacitor Cgd of the FET Q1 or Q2.

As illustrated in FIG. 13, in the circuit C, the feedback capacitance Cfb is hardly affected by the length L2. This is because the gate-drain capacitance Cgd is suppressed mainly by the top portion 21*b*, and the gate-drain capacitance Cgd does not change much even if the length L2 of the bottom portion 21*a* in the X direction changes. When the FETs Q1 and Q2 are connected in parallel as in the circuit B, the feedback capacitance Cfb of the circuit B becomes 2×Cgd, which is twice as large as that of the circuit C. In the circuit A, the feedback capacitor Cfb is a capacitor in which the gate-drain capacitor Cgd of the FET Q1 and the drain-source capacitor Cds of the FET Q2 are connected in series. Therefore, the feedback capacitance Cfb of the circuit A is smaller than the feedback capacitance Cfb (i.e., the gate-drain capacitance Cgd) of the circuit C. As illustrated in FIG. 12, the drain-source capacitance Cds of the FET Q2 increases as the length L2 increases, and therefore, the feedback capacitance Cfb of the circuit A increases as the length L2 increases. However, even when the length L2 is 1.4 μm, the feedback capacitance Cfb of the circuit A is smaller than the feedback capacitance Cfb of the circuit C. Thus, the circuit A of the first embodiment has a smaller feedback capacitance Cfb than the circuit B of the first comparative example, and can increase the maximum oscillation frequency.

By increasing the length L2*b* corresponding to the length L2 of the FET Q2 in this manner, the electric field concentration in the semiconductor layer 12 between the gate electrode 18 and the drain electrode 16 of the FET Q2 can be suppressed, and the influence on an increase in the feedback capacitance Cfb can be reduced. However, when the length L2*a* of the FET Q1 increases, the drain-source capacitance of the FET Q1 increases. This causes deterioration of the high frequency characteristics such as narrowing of the band of the amplifier circuit 100. Therefore, the distance L1*a* (first distance) in the FET Q1 is made shorter than the distance L1*b* (second distance) in the FET Q2. That is, the length L2*a* (first length) of the FET Q1 is made shorter than the length L2*b* (second length) of the FET Q2. This makes it possible to reduce the electric field concentration in the semiconductor layer 12 between the gate electrode 18 and the drain electrode 16 in the FET Q2. Therefore, the drain breakdown voltage can be improved. In addition, the memory effect can be suppressed. Furthermore, the drain-source capacitance Cds of the FET Q1 can be reduced. This makes it possible to improve the high frequency characteristics such as widening the band of the amplifier circuit 100.

The lengths L2*a* and L2*b* are the lengths of the portions of the lower surfaces of the field plates 20*a* and 20*b* in the X direction, which are parallel to the upper surface of the semiconductor layer 12 (that is, the bottom portions 21*a*). The portion parallel (substantially parallel) to the upper surface of the semiconductor layer 12 allows variations due to manufacturing errors in the thickness of the insulating film formed between the bottom portion 21*a* and the semiconductor layer 12. For example, a distance between the lower surface of the bottom portion 21*a* and the upper surface of the semiconductor layer 12 may vary within a range of ±10%.

From the viewpoint of reducing the electric field concentration in the semiconductor layer 12 between the gate electrode 18 and the drain electrode 16 in the FET Q2, the length L2*a* may be set to 0.9 times or less, 0.8 times or less, or 0.5 times or less the length L2*b*. If the length L2*a* is too short, it is hard to suppress the electric field concentration between the gate electrode 18 and the drain electrode 16 in the FET Q1. From this viewpoint, the length L2*a* may be set to 0.1 times or more the length L2*b*.

Similarly, from the viewpoint of reducing the electric field concentration in the semiconductor layer 12 between the gate electrode 18 and the drain electrode 16 in the FET Q2, the distance L1*a* may be set to 0.9 times or less, 0.8 times or less, or 0.5 times or less the distance L1*b*. If the distance L1*a* is too short, it is hard to suppress the electric field concentration between the gate electrode 18 and the drain electrode 16 in the FET Q1. From this viewpoint, the distance L1*a* may be set to 0.1 times or more the distance L1*b*.

If the length L2*a* of the FET Q1 is too short, the effect of suppressing the electric field concentration in the semiconductor layer 12 between the gate electrode 18 and the drain electrode 16 reduces. From this viewpoint, the length L2*a* may be 0.1 μm or more, or 0.2 μm or more. If the length L2*a* is too long, the drain-source capacitance Cds increases.

From this viewpoint, the length L2*a* may be 1.0 μm or less, or 0.5 μm or less. If the length L2*b* of the FET Q2 is too short, the effect of suppressing the electric field concentration in the semiconductor layer 12 between the gate electrode 18 and the drain electrode 16 reduces. From this viewpoint, the length L2*b* may be 0.5 μm or more, or 1.0 μm or more. If the length L2*b* is too long, the drain-source capacitance Cds increases. From this viewpoint, the length L2*b* may be set to 3.0 μm or less, or 2.0 μm or less.

When the gate-drain distance Lgd is taken as a reference, the length L2*a* may be 0.02 times or more, 0.04 times or more, 0.2 times or less, or 0.1 times or less the distance Lgd. The length L2*b* may be 0.1 times or more, 0.2 times or more, 1.0 times or less, or 0.5 times or less the distance Lgd.

The field plates 20*a* and 20*b* are at the same potential as the source electrode 14. This makes it possible to suppress the electric field concentration in the semiconductor layer 12 between the gate electrode 18 and the drain electrode 16 in the FET Q2. The same potential (or substantially the same potential) allows a potential difference due to the influence of the parasitic resistance, the parasitic inductance and the parasitic capacitor.

The gate width Wg of the FET Q1 is the same as the gate width Wg of the FET Q2. In this case, a potential difference Vg-Vd of the FET Q2 is larger than the potential difference Vg-Vd of the FET Q1. Therefore, by making the distance L1*a* shorter than the distance L1*b*, the electric field concentration in the semiconductor layer 12 between the gate electrode 18 and the drain electrode 16 in the FET Q2 can be suppressed. The term "gate width Wg is the same (substantially the same)" means that the potential difference Vg−Vd of the FET Q2 should be larger than the potential difference Vg−Vd of the FET Q1. For example, when the gate width Wg of the FET Q1 is Wg1 and the gate width Wg of the FET Q2 is Wg2, $2\times|Wg1-Wg2|/(Wg1+Wg2)$ may be 0.1 or less.

When the gate width Wg of the FET Q1 and the gate width Wg of the FET Q2 are the same as each other, the gate bias voltage VG1 (first gate bias voltage) of the FET Q1 is equal to a value obtained by subtracting a half of the drain bias voltage VD from the gate bias voltage VG2 (second gate bias voltage) of the FET Q2. That is, $VG1=VG2-VD/2$ is satisfied. In this case, the potential difference Vg−Vd of the FET Q2 is larger than the potential difference Vg−Vd of the FET Q1. Therefore, by making the distance L1*a* shorter than the distance L1*b*, the electric field concentration in the semiconductor layer 12 between the gate electrode 18 and the drain electrode 16 in the FET Q2 can be suppressed. The term "VG1 is the same as (approximately same as) VG2−VD/2" means that the potential difference Vg−Vd of the FET Q2 should be larger than the potential difference Vg−Vd of the FET Q1. For example, $VG1-(VG2-VD/2)<VD/25$ is sufficient.

The structures of the FET Q1 and the FEF Q2 are the same as each other. For example, in addition to the gate widths Wg, the gate lengths Lg are the same as each other, the distances Lsg are the same as each other, and the distances Lgd are the same as each other. For example, when Lg, Lsg, and Lgd of the FET Q1 are Lg1, Lsg1, and Lgd1, respectively, and Lg, Lsg, and Lgd of the FET Q2 are Lg2, Lsg2, and Lgd2, respectively, $2\times Lg1-Lg2/(Lg1+Lg2)$ may be 0.1 or less, $2\times Lsg1-Lsg2/(Lsg1+Lsg2)$ may be 0.1 or less, and $2\times Lgd1-Lgd2/(Lgd1+Lgd2)$ may be 0.1 or less. In this case, the potential difference Vg−Vd of the FET Q2 is larger than the potential difference Vg−Vd of the FET Q1. Therefore, by making the distance L1*a* shorter than the distance L1*b*, the electric field concentration in the semiconductor layer 12 between the gate electrode 18 and the drain electrode 16 can be suppressed. The FET Q1 and the FEF Q2 may have different structures from each other.

The FETs Q1 and Q2 are integrated on the same substrate 10, and the semiconductor layer 12 in the FETs Q1 and Q2 is the same. In this case, the potential difference Vg−Vd of the FET Q2 is larger than the potential difference Vg−Vd of the FET Q1. Therefore, by making the distance L1*a* shorter than the distance L1*b*, the electric field concentration in the semiconductor layer 12 between the gate electrode 18 and the drain electrode 16 can be suppressed. The FET Q1 and the FEF Q2 may be provided on different substrates.

When the semiconductor layer 12 is a nitride semiconductor layer, the memory effect increases. Therefore, when the semiconductor layer 12 is the nitride semiconductor layer, the distance L1*a* is made shorter than the distance L1*b*, and the length L2*a* is made shorter than the length L2*b*. This makes it possible to suppress the memory effect in the FET Q2. The nitride semiconductor layer includes at least one layer of, for example, a gallium nitride layer, an aluminum gallium nitride layer, and an indium gallium nitride (InGaN) layer.

As illustrated in FIGS. 3 and 4, at least a part of the field plates 20*a* and 20*b* overlaps at least a part of the gate electrode 18 when viewed from the Z direction. This makes it possible to suppress the gate-drain capacitance Cgd in the FETs Q1 and Q2.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. An amplifier circuit comprising:

a semiconductor layer;

a first FET (Field Effect Transistor) including a first source electrode provided on the semiconductor layer and connected to a first reference potential in a high frequency manner, a first gate electrode provided on the semiconductor layer and configured to receive a high frequency signal, a first drain electrode provided on the semiconductor layer, and a first field plate having at least a part thereof provided above the semiconductor layer between the first gate electrode and the first drain electrode; and a second FET including a second source electrode provided on the semiconductor layer and electrically connected to the first drain electrode, a second gate electrode provided on the semiconductor layer and connected to a second reference potential in the high frequency manner, a second drain electrode provided on the semiconductor layer and configured to output a high frequency signal, and a second field plate having at least a part thereof provided above the semiconductor layer between the second gate electrode and the second drain electrode;

wherein a first distance between an end closer to the first drain electrode in ends of a surface of the first gate electrode facing the semiconductor layer and an end closer to the first drain electrode in ends of the first field plate is shorter than a second distance between an end closer to the second drain electrode in ends of a surface of the second gate electrode facing the semiconductor layer and an end closer to the second drain electrode in ends of the second field plate.

2. The amplifier circuit according to claim 1, wherein the first field plate and the first source electrode have a same potential, and the second field plate and the second source electrode have a same potential.

3. The amplifier circuit according to claim 1, wherein the first distance is 0.9 times or less the second distance.

4. The amplifier circuit according to claim 1, wherein a first length of a portion of a lower surface of the first field plate parallel to an upper surface of the semiconductor layer in a direction in which the first gate electrode and the first drain electrode are arranged is shorter than a second length of a portion of a lower surface of the second field plate parallel to an upper surface of the semiconductor layer in a direction in which the second gate electrode and the second drain electrode are arranged.

5. The amplifier circuit according to claim 4, wherein the first length is 0.9 times or less the second length.

6. The amplifier circuit according to claim 4, wherein the first length is 0.02 times or more and 0.2 times or less a distance between the first gate electrode and the first drain electrode, and the second length is 0.1 times or more and 0.5 times or less a distance between the second gate electrode and the second drain electrode.

7. The amplifier circuit according to claim 1, wherein a gate width of the first FET is the same as a gate width of the second FET.

8. The amplifier circuit according to claim 7, wherein a first gate bias voltage applied to the first gate electrode is equal to a value obtained by subtracting a half of a drain bias voltage applied to the second drain electrode from a second gate bias voltage applied to the second gate electrode.

9. The amplifier circuit according to claim 1, wherein the semiconductor layer is a nitride semiconductor layer.

10. The amplifier circuit according to claim 1, wherein at least the part of the first field plate overlaps at least a part of the first gate electrode when viewed in a thickness direction of the semiconductor layer, and at least the part of the second field plate overlaps at least a part of the second gate electrode when viewed in the thickness direction of the semiconductor layer.

* * * * *